United States Patent
Ling

(10) Patent No.: US 6,323,110 B2
(45) Date of Patent: Nov. 27, 2001

(54) STRUCTURE AND FABRICATION PROCESS OF SILICON ON INSULATOR WAFER

(75) Inventor: Peiching Ling, San Jose, CA (US)

(73) Assignee: Advanced Materials Engineering Research Inc., Sunnyvale, CA (US)

( * ) Notice: Subject to any disclaimer, the term of this patent is extended or adjusted under 35 U.S.C. 154(b) by 0 days.

(21) Appl. No.: 09/755,745

(22) Filed: Jan. 4, 2001

Related U.S. Application Data

(62) Division of application No. 08/145,942, filed on Oct. 29, 1993, now abandoned.

(51) Int. Cl.[7] .............................. H01L 21/30; H01L 21/46
(52) U.S. Cl. .................. 438/459; 438/977; 148/DIG. 12
(58) Field of Search ..................................... 438/404, 406, 438/455, 456, 458, 459, 977; 148/DIG. 2

(56) References Cited

U.S. PATENT DOCUMENTS

| | | | | |
|---|---|---|---|---|
| 4,601,779 | * | 7/1986 | Abernathy et al. | 438/459 |
| 4,700,466 | * | 10/1987 | Nakagawa et al. | 438/141 |
| 4,888,304 | * | 12/1989 | Nakagawa et al. | 438/406 |
| 4,948,748 | * | 8/1990 | Kitahara et al. | 438/405 |
| 5,013,681 | * | 5/1991 | Godbey et al. | 438/459 |
| 5,213,986 | * | 5/1993 | Pinker et al. | 438/459 |
| 5,234,535 | * | 8/1993 | Beyer et al. | 438/459 |
| 5,240,876 | * | 8/1993 | Gaul et al. | 438/459 |
| 5,260,233 | * | 11/1993 | Buti et al. | 438/311 |
| 5,308,776 | * | 5/1994 | Gotou | 438/165 |
| 5,310,451 | * | 5/1994 | Tejwani et al. | 438/459 |
| 5,344,524 | * | 9/1994 | Sharma et al. | 438/459 |
| 5,356,827 | * | 10/1994 | Ohoka | 438/455 |
| 5,366,923 | * | 11/1994 | Beyer et al. | 438/406 |
| 5,387,555 | * | 2/1995 | Linn et al. | 438/234 |
| 5,436,173 | * | 7/1995 | Houston | 438/155 |
| 5,453,394 | * | 9/1995 | Yonehara et al. | 438/479 |
| 5,488,012 | * | 1/1996 | McCarthy | 438/455 |

* cited by examiner

*Primary Examiner*—Charles Bowers
*Assistant Examiner*—Asok K. Sarkar
(74) *Attorney, Agent, or Firm*—Bo-In Lin

(57) ABSTRACT

The present invention discloses a wafer which includes a semiconductor substrate having a top surface and a device layer disposed near the top surface for fabrication of integrated circuits (ICs) therein. The wafer also includes an insulating layer beneath the device layer for insulating the device layer with the ICs to be fabricated therein. The wafer further includes a doped region in the substrate. The doped region may be a layer beneath the insulating layer. The doped region is a region of sufficient volume whereby the doped region may be used as a charge sink for protecting the IC devices to be fabricated on the device layer from being damaged by the electric static discharge (ESD) and electric over stress (EOS). Furthermore, the doped region is a region of sufficient dopant concentration whereby the doped region may be used as an electrical connecting means for the IC devices to be fabricated in the device layer such that the doped region becomes a part of integration of the IC devices.

8 Claims, 10 Drawing Sheets

STRUCTURE AND FABRICATION PROCESS OF SILICON ON INSULATOR WAFER

This Application is a Divisional Application of the original patent application Ser. No. 08/145,942 filed on Oct. 29, 1993, now abandoned.

BACKGROUND OF THE INVENTION

1. Field of the Invention

This invention relates generally to the structure and fabrication process of silicon on insulator (SOI) wafers for making the integrated circuits (ICs) thereon. More particularly, this invention relates to the structure and fabrication process of SOI wafers for making integrated circuits (ICs) thereon which has larger volume for current sink and has reduced susceptibility to electric static discharge (ESD) and electric over stress (EOS).

2. Description of the Prior Art

Even though the technology for making the silicon on insulator (SOI) wafer has demonstrated significant progress recently such that integrated circuit (IC) devices of high speed can be fabricated thereon with less complicate processes. However, widespread application of this technology is still limited by several technical difficulties. The primary major concern for IC devices made on SOI wafer is their susceptibility to damages caused by electric static discharge (ESD) or electric over stress (EOS). The wafers employed in IC devices fabrication generally comprise a thin layer on the top surface of the wafers for the processing and fabrication of various IC circuits. This thin device layer is then supported by a substrate composed mostly of dielelctric materials forming a much thicker bulk region. The silicon on insulator (SOI) wafer provides an insulating layer, e.g., a silicon dioxide ($SiO_2$) layer, which insulates and separates the bulk region of the substrate from the the device region. FIG. 1 shows a cross sectional view of a conventional SOI wafer which includes a silicon or epitaxy layer 10, an insulating layer 20 and a bulk silicon region 30. Generally, the silicon or epitaxy layer 10 is generally a device region with a thickness ranging from approximately 500 to 20,0000 angstroms. The insulating layer, e.g., an $SiO_2$ layer, is approximately 1,000 to 10,000 angstroms in thickness. The bulk region 30 supports the whole structure which can be a polysilicon region to maintain the cost of fabrication at a low level.

There are several advantages provided by the technique of fabricating IC devices on the SOI wafers over the general IC devices made on bulk substrate. First, the parasitic effects between the devices and the substrate, especially the parasitic capacitance, can be eliminated. Since this parasitic capacitance increases with the substrate doping and that the doping concentration is greatly increased in modem submicron devices, this SOI advantage becomes more important for modem submicron devices. Secondly, another parasitic problem, i.e., the latchup, which often becomes more severe as the dimension of the IC devices becomes smaller, can also be avoided by fabricating IC devices on the SOI wafer. The SOI wafers thus provide a supporting structure more advantageous for fabricating IC devices of smaller dimension with improved integration density and high speed performance.

However, since the bulk material of an SOI wafer is now separated by the insulating layer from the device region, electrically the bulk material of the substrate is no longer part of the device integration. The use of substrate for defining a constant electric potential or using the well taps in electric contact with the substrate to stabilize channel threshold voltages ($V_T$) for the IC devices are no longer feasible. Furthermore, the traditional design of employing the large volume of the well in the bulk region as a current sink for sudden high density current to prevent the occurrence of ESD or ESO is also not achievable on the SOI wafer. The IC devices on the SOI wafers may become very susceptible to ESD or EOS damages. This concern becomes more critical as the IC circuits are fabricated with smaller dimension and more sensitive and susceptible to spikes of high density currents. Therefore, unless this technical problem is resolved, even with the significant advantages and recent technical progress made in SOI wafers process, application of the SOI wafers for IC device fabrication is still greatly limited.

Besides the ESD and EOS problems, the IC devices on SOI wafer have another difficulty due to the fact that the electric potential in the channel region of the transistor area is floating as it is now insulated from the bulk substrate by the underlying insulator film. In a conventional bulk transistor, electrical connection can be easily made via the substrate to a body node and the relatively fixed bias of a body node provides a stable threshold voltage relative to the drain to source voltage. However, in most SOI transistors, the undepleted volume within the body region underneath the gate electrode now functions as a body node. The electric potential of the body node is important for the determination of the threshold voltage of an IC device. However, the volume near the body node under the channel region has now become electrically floating as the volume is insulated from the substrate by the underlying insulating dioxide layer. The effective threshold of the transistors may be adversely affected which causes great uncertainty in designing and controlling operational characteristics of the transistor devices fabricated on the SOI wafers.

The transistor fabricated on an SOI structure further encounter another problem commonly recognized as the parasitic 'back channel' effect. It is caused by a 'back channel transistor' configuration where the substrate functions as a gate and the insulator film underlying the transistor functions as a gate dielectric. This back channel may cause a drain to source leakage path along the body node underneath the gate channel near the interface with the insulating film. Furthermore, a capacitive coupling is formed between the drain and the source over the dielectrically insulated body node which often bias the potential of the body node thus affecting the threshold voltage as well. All the above described factors may cause voltage shifts and add to greater uncertainties in designing and stabilizing the gate threshold voltage for the IC devices to be fabricated on the device layer n an SOI wafer.

Several techniques are proposed in order to overcome this difficulty. Houston et al. disclose in U.S. Pat. No. 5,185,280, entitled 'Method of fabricating a SOI transistor with Pocket Implant and Body-to-Source (BTS) Contact', a SOI MOS transistor that has an implanted region of the same conductivity type as the body underneath one or both of the extended drain and source portions of the drain and the source with and without a BTS contact or a general body contact. The purpose is to use the 'pocket implants' to enhance the gate threshold voltage by reducing the back gate current. Ohmic connection between the source and the body is then made by silicidation.

The transistor as proposed by Houston et al. may have an enhanced threshold voltage, however, the difficulties caused by the floating potential of the body node is not completed resolved. By the use of the pocket implants, the voltage fluctuation at the body node may be reduced, however, as the small volume of the 'body node' underneath the gate channel is still insulated, its voltage is still floating. This floating voltage can not be conveniently stabilized and thus becomes easily biased by the substrate voltage due to the 'back channel' transistor effect and any other voltage changes near the transistor. The threshold voltage is therefore not definitely controllable in the disclosed configuration. Additionally, the technique disclose by Houston et al. has to be implemented with more complex designs and fabrication processes which have to be carries out in the very thin device layer and may greatly increase the cost of the devices.

Several U.S. Patents, including U.S. Pat. No. 4,899,202 entitled 'High Performance Silicon-on-insulator Transistor with Body Node to Source Node Connection' (Issued on Feb. 6, 1990 to Blake et al.), U.S. Pat. No. 4,906,587 entitled 'Making A Silicon-on-insulator Transistor with Selectable Body Node to Source Node Connection' (Issued on Mar. 6, 1990 to Blake), U.S. Pat. No. 4,946,799 entitled 'Process for Making A High Performance Silicon-on-insulator Transistor with Body Node to Source Node Connection' (Issued on Aug. 7, 1990 to Blake et al.), U.S. Pat. No. 5,079,605 entitled 'Silicon-on-insulator Transistor with Selectable Body Node to Source Node Connection' (Issued on Jan. 7, 1992 to Blake), disclose SOI MOS transistors which have implanted 'contact regions on both the source and the drain sides of the gate electrode for potentially making contact with the body node from either side. The major purposes of the transistors disclosed in these patents twofold. First, a connection between a source node and a body node for the transistors fabricated on SOI wafers is provided. And secondly, the source to body connection can be fabricated with reduced mask requirements and to allow greater flexibility in device design that the selection of the drain or source can be made at a later stage of device fabrication.

Again, the transistors disclosed by these patents may have some improvements in reduced leakage currents, increased threshold voltage, reduced channel width, or reduced mask requirements, but the basic problem of a floating channel potential is still not resolved. The same difficulties and limitations as that encountered by the transistors as described for devices proposed by Houston et al. would still limit the application of the SOI technology to IC fabrication.

Most critically, the major technical concerns for SOI devices, namely, the ESD and EOS susceptibility of these devices are not addressed by these prior art structure and fabrication methods. The small volume afforded by the thin layer for device fabrication on a conventional Sol wafer is intrinsically not sufficient to provide feasible solutions to overcome the ESD and EOS difficulties Therefore, there is still a need in the art of IC device fabrication, particularly on the SOI wafers, to provide a structure and fabrication process that would resolve these limitations.

SUMMARY OF THE PRESENT INVENTION

It is therefore an object of the present invention to provide a structure and fabrication process of an SOI wafer to overcome the aforementioned difficulties encountered in the prior art.

Specifically, it is an object of the present invention to provide an SOI wafer structure and fabrication process to fabricate IC devices thereon which have the advantageous features of the SOI wafer without being limited by the technical difficulties of ESD or ESO problems.

Another object of the present invention is to provide an SOI wafer structure and fabrication method that provide an intrinsic highly doped region underneath the insulating layer serving as well to the device integration as part of input circuit protection against ESD or ESO damages to the IC devices.

Another object of the present invention is to provide an SOI wafer structure and fabrication method that provide an intrinsic highly doped region underneath the insulating layer that can be flexibly used to connect with the device region as butting contact for stabilization or as resistor to achieve better stabilized potential and transistor performance.

Another object of the present invention is to provide an SOI wafer structure and fabrication method that electric contacts are provided between the device region and an intrinsic highly doped region underneath the insulating layer such that most of the traditional silicon or epitaxy processes can be conveniently applied.

Another object of the present invention is to provide an SOI wafer structure and fabrication method that electric contacts are provided between the device region and an intrinsic highly doped region underneath the insulating layer such that greater dimension for device integration is allowed.

Briefly, in a preferred embodiment, the present invention comprises a wafer which includes a semiconductor substrate having a top surface and a device layer disposed near the top surface for fabrication of integrated circuits (ICs) therein. The wafer also includes an insulating layer beneath the device layer for insulating the device layer with the ICs to be fabricated therein. The wafer further includes a doped region in the substrate. The doped region may be a layer beneath the insulating layer. Also, the doped region is a region of sufficient volume whereby the doped region may be used as a charge sink for protecting the IC devices to be fabricated on the device layer from being damaged by the electric static discharge (ESD) and electric over stress (EOS). Furthermore, the doped region is a region of sufficient dopant concentration whereby the doped region may be used as an electrical connecting means for the IC devices to be fabricated in the device layer such that the doped region becomes a part of integration of the IC devices.

It is an advantage of the present invention that it provides an SOI wafer structure and fabrication process to fabricate IC devices thereon which have the advantageous features of the SOI wafer without being limited by the technical difficulties of ESD or ESO problems.

Another advantage of the present invention is that it provides an SOI wafer structure and fabrication method that provide an intrinsic highly doped region underneath the insulating layer serving as well to the device integration as part of input circuit protection against ESD or ESO damages to the IC devices.

Another advantage of the present invention is that it provides an SOI wafer structure and fabrication method that provide an intrinsic highly doped region underneath the insulating layer that can be flexibly used to connect with the device region as butting contact for stabilization or as resistor to achieve better stabilized potential and transistor performance.

Another advantage of the present invention is that it provides an SOI wafer structure and fabrication method that electric contacts are provided between the device region and an intrinsic highly doped region underneath the insulating layer such that most of the traditional silicon or epitaxy processes can be conveniently applied.

Another advantage of the present invention is that it provides an SOI wafer structure and fabrication method that electric contacts are provided between the device region and an intrinsic highly doped region underneath the insulating layer such that greater dimension for device integration is allowed.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
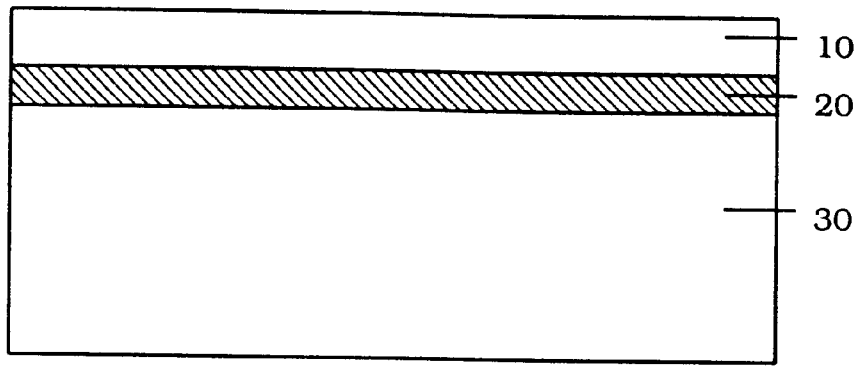
FIG. 1 is a cross-sectional view of a prior art structure of a general SOI wafer.
Figure 2:
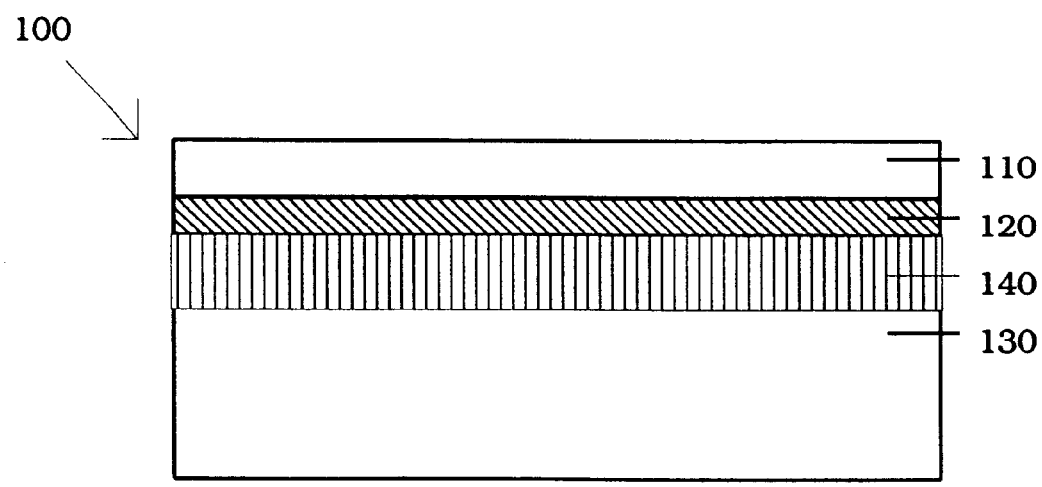
FIG. 2 is a cross-sectional view of the layer structure of an SOI wafer according to the present invention.

FIG. 2 shows a cross-sectional view of a preferred embodiment comprising an SOI wafer 100 in accordance with the principle and the fabrication processes of the present intention. A silicon substrate 130 is used for the fabrication of this SOI wafer 100 thereon. Like the conventional SOI wafer, the wafer 100 has a device layer 110, an insulating layer 120 and a bulk substrate region 130. Underneath the insulating 120, there is an added highly doped layer 140. The thickness of the highly doped layer 140 ranges from approximately 5,000 to approximately 50,000 angstroms. The device layer 110, the highly doped layer 140, and the bulk zone 130 can be either N or P type or at any combination of them for specific device processes and applications.

FIG. 2 thus shows a preferred embodiment of the present invention which comprises a wafer 100 which includes a semiconductor substrate 130 having a top surface and a device layer 110 disposed near the top surface for fabrication of integrated circuits (ICs) therein. The wafer 100 also includes an insulating layer 120 beneath the device layer for insulating the device layer 110 with the ICs to be fabricated therein. The wafer further includes a doped region 140 in the substrate 130. The doped region 140 is a region of sufficient volume whereby the doped region 140 may be used as a charge sink for protecting the IC devices to be fabricated on the device layer 110 from being damaged by the electric static discharge (ESD) and electric over stress (EOS). The doped region 140 is a region of sufficient dopant concentration whereby the doped region may be used as an electrical connecting means for the IC devices to be fabricated in the device layer 110 such that the doped region 140 becomes a part of integration of the IC devices. Depending on the IC devices to be fabricated by employing the wafer 100, The doped region 140 may be configured and patterned into a plurality of sub-regions wherein each of the sub-regions may be doped with dopants of different conductivity types and dopant concentrations suitable for the IC devices to be fabricated in the device layer 110.

The layer structure of an SOI wafer as shown in FIG. 2 may be processed by either a bond and etch silicon on insulator (BESOI) or a silicon implanted with oxide (SIMOX) wafer. The BESOI wafers have the advantage that the process allows more flexibilities in selecting the conductivity types, material and dopant concentration on both sides of the insulation layer. The SIMOX wafers on the other hand employ simple wafer fabrication steps and are more economical. As described below, the advantages of the SOI layer structure as disclosed in the present invention can be realized in both type of wafers.

With this highly doped layer 140, by providing substrate contact or down tap contacts, another dimension for device integration is available for the designers. In addition to direct connection lines, the highly doped layer 140 may provide a common voltage connection means such that a very stable substrate voltage can be established just like the conventional bulk type of wafer for IC fabrication.

Figure 3A:
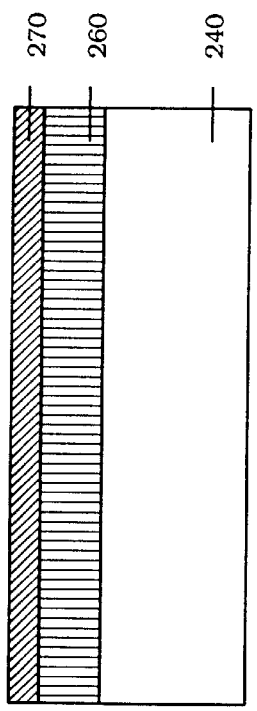
FIGS. 3A–3D are diagrams illustrating by sequential cross-sectional views for representation of the processing steps of the present invention in making a BESOI wafer of FIG. 3.

The SOI wafer 100 as shown in FIG. 2 can fabricated by the processing steps as described below with each step described sequentially with one of the pictures in FIGS. 3A to 3D. Referring to FIG. 3A, the fabrication process is initiated starting from a semi-insulating undoped or lightly P-type or N-type doped silicon substrate 210 upon which a epitaxy layer 220 is formed. One oxide layer 230 is then formed on top of the epitaxy layer 220 by the use of standard oxidization processes. Depending on the intended application of the final BESOI wafer is intended, the epitaxy layer 220 can be an optional layer for the wafer structure. FIG. 3B shows another silicon wafer 240 implanted with high concentration dopant 250 to form a highly doped layer 260 near the top surface of the silicon wafer 240.

Figure 3C:
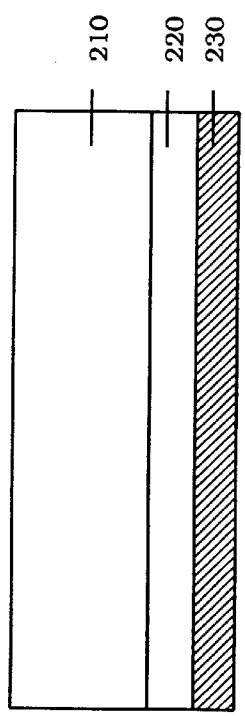
Figure 3D:
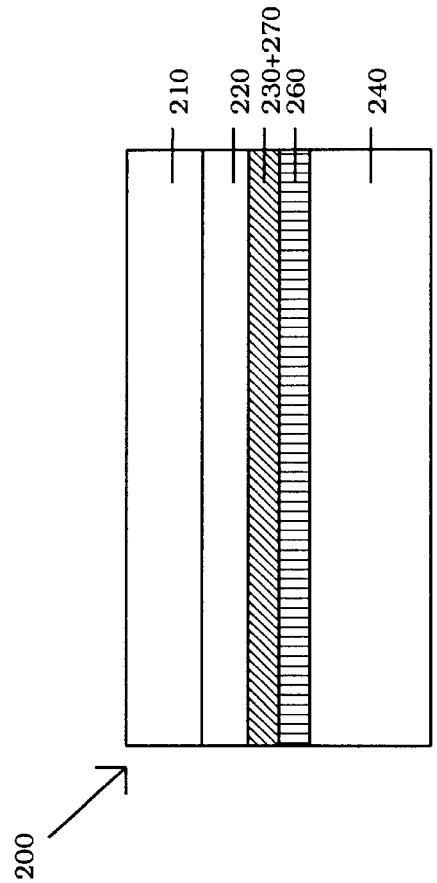
Figure 3B:
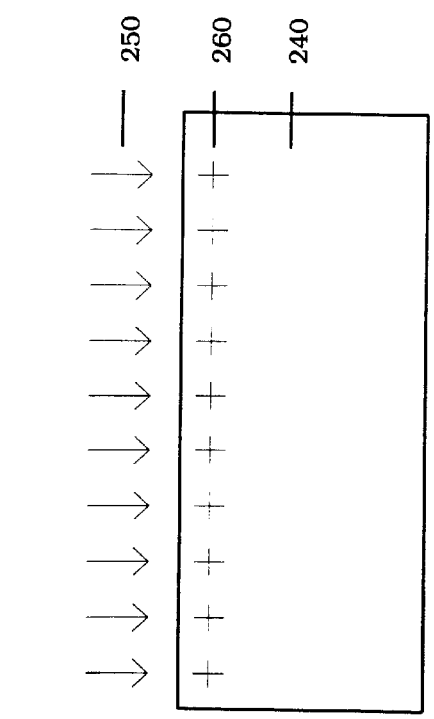

FIG. 3C shows a subsequent processing step by applying an oxidation step to the silicon wafer 240 to form an oxidation layer 270 on top of the highly doped layer 260. FIG. 3D shows a wafer which combines the wafer shown if FIG. 3A and the wafer shown in FIG. 3C. These two wafers are bonded with oxide glue to each other with the oxide layer 230 and the oxide layer 270 abutting each other firming a layer (230+270). For a BESOI with epitaxy layer 220, the oxide layer 210 is ground off so is part of the epitaxy layer 220 to a specific layer thickness.

This invention thus teaches a method for fabricating a bond and etch silicon on insulator with well (BESOIW) wafer which comprises the steps of (a) forming a first oxide layer 230 on top of a first silicon substrate 210; (b) forming a doped layer 260 on a top surface of a second silicon substrate 240; (c) forming a second oxide layer 270 on top of the doped layer 260; (d) boding the first oxide layer 230 to the second oxide layer 270; and (e) grinding off a portion of the first silicon substrate 210 to form a thin silicon layer.

Figure 4A:
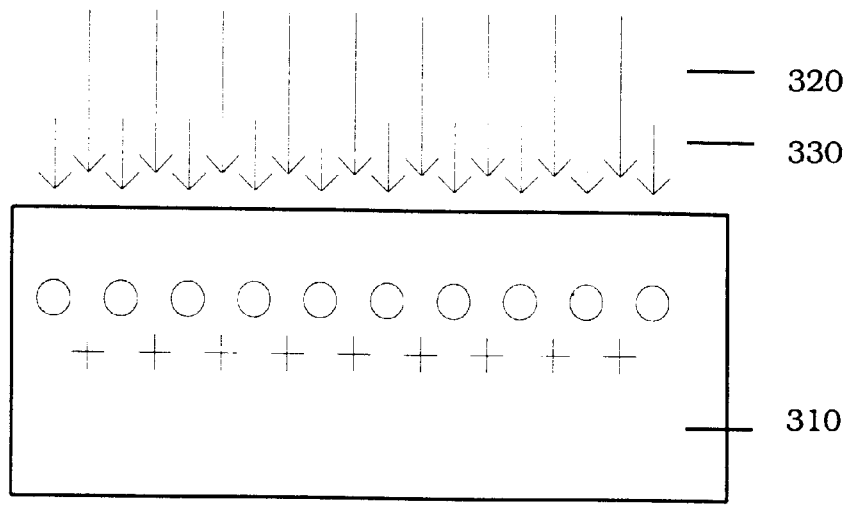
FIGS. 4A–4B are diagrams illustrating by sequential cross-sectional views for representation of the processing steps of the present invention in making a SIMOX SOI wafer.
Figure 4B:
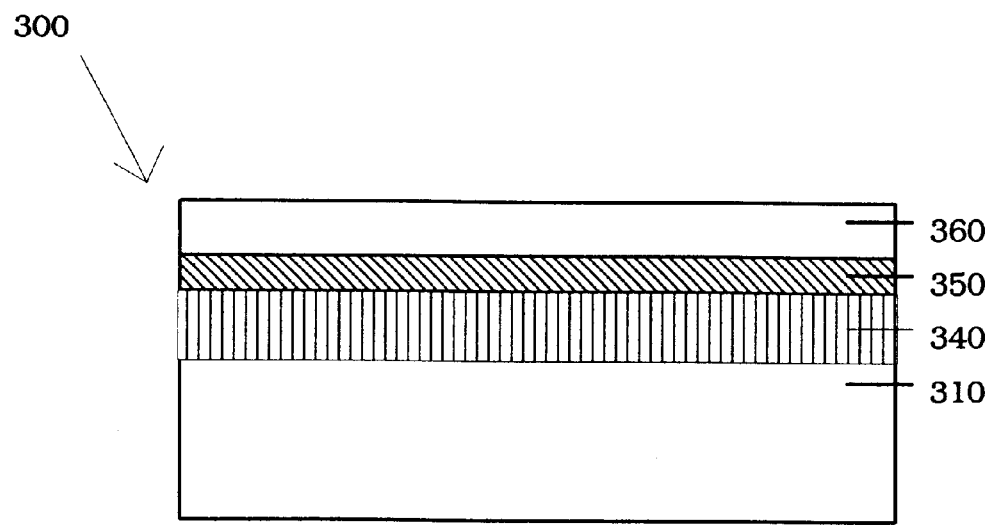

Please referring to FIGS. 4A to 4B for fabrication process for a silicon with implanted oxide (SIMOX) type of SOI 300. A silicon substrate 310 is used for implantation of a high energy dopant 320 like phosphate or boron and an oxide implanting dopant 330 is also used to form an oxide layer. The implantation depth of the oxidizing dopant 330 is much shallower than the depth of the high energy dopant 320. In a preferred embodiment, the peak concentration produced by the high energy dopant 320 is about 5000 to 10,000 angstroms deeper than the peak concentration produced by the oxide dopant 330 implantation. FIG. 4B shows the layer structure formed as the result of implantation illustrated in FIG. 4A. A shallower oxide layer 350 is formed on top of the deeper dopant layer 340 in the silicon substrate 310, while a device layer 360 is formed directly above the oxide layer 350 and beneath the top surface of the substrate 310.

This invention also teaches a method for fabricating a silicon with implanted oxide (SIMOX) silicon on insulator (SOI) wafer. The method includes steps of of (a) forming an oxide layer 350 by implantation beneath a top surface of a silicon substrate 310 thus forming a thin layer of silicon near the top surface of the substrate; and (b) forming a doped layer 340 in a silicon substrate 310 beneath the oxide layer.

Figure 5A:
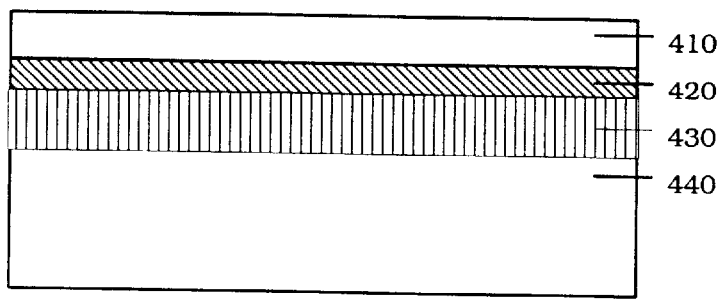
FIGS. 5A–5F are diagrams illustrating by sequential cross-sectional views for representation of the processing steps of the present invention in making a substrate contact for a SOI wafer.
Figure 5B:
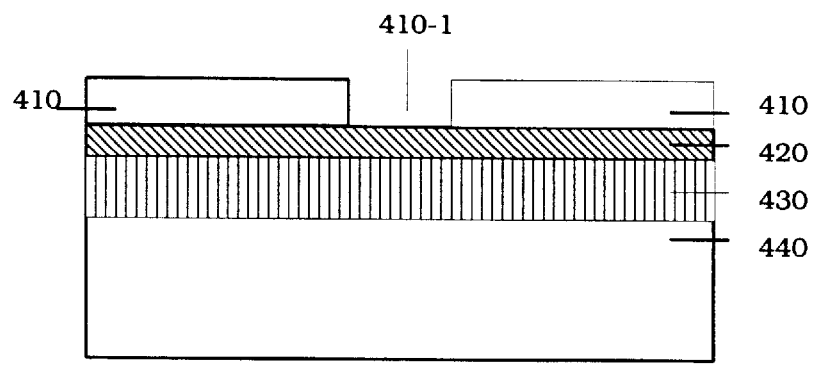
Figure 5C:
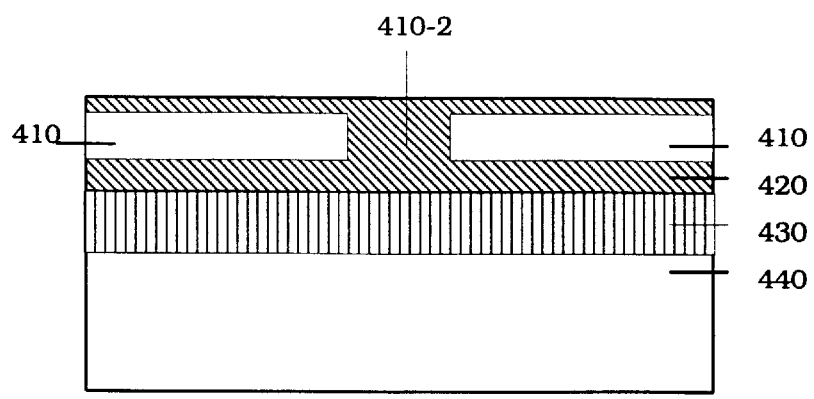
Figure 5D:
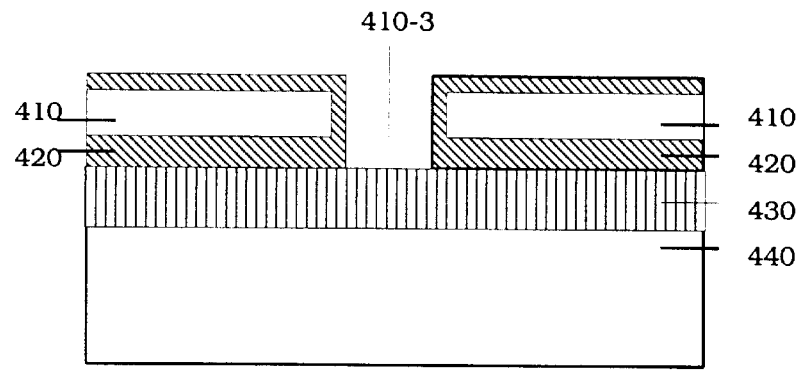
Figure 5E:
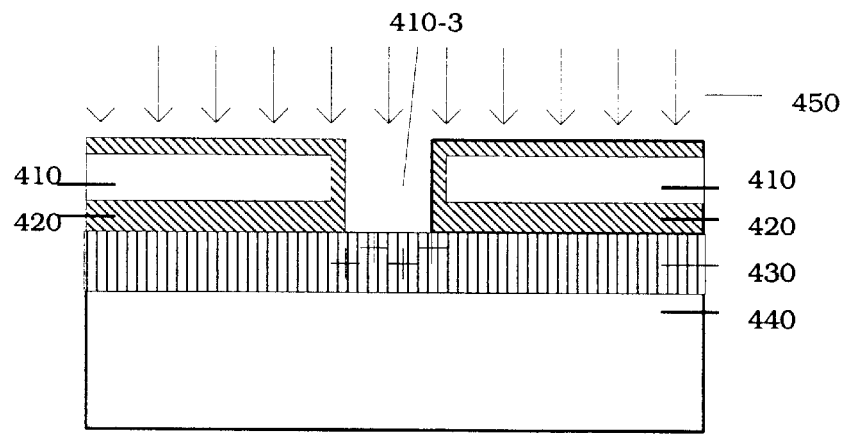
Figure 5F:
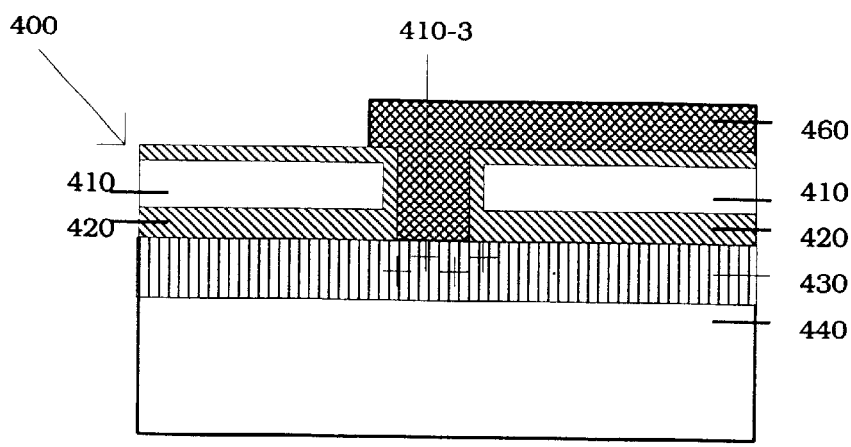

FIGS. 5A to 5F show the processing steps for generating a substrate contact for the IC devices on the SOI wafer 400 according to the present invention. FIG. 5A show that the SOI wafer 400 is supported on a substrate bulk region 440 wherein a highly doped layer 430, an insulating layer comprising silicon dioxide 420 and a silicon or epitaxy layer 410 are formed one on top of another in sequence. In FIG. 5B, a portion 410-1 of the top layer, i.e., the silicon or epitaxy layer 410, is patterned and etched away to the top surface of the oxide layer 420. In FIG. 5C, the removed area 410 and the entire top surface area of the wafer is then covered by an oxide layer 410-2. In FIG. 5D, a contact opening 410-3 is produced by patterning and etching away the opening 410-3 down to the top surface of the highly doped layer 430. In FIG. 5E, an ohmic contact is then formed by implanting metallic ions 450 into the contact opening 410-3 to form an implant contact zone 430-1 on top of the highly doped layer 430 underneath the contact opening 410-3. In FIG. 5F, a metal contact 460 is then formed by depositing metal into the contact opening 410-3. A substrate contact is formed through the metal contact 460 which connects the substrate via the implanting zone 430-1 to the external circuits (not shown) when necessary.

By the use of the above processes, a SOI wafer 400 provided with an access for substrate contact is fabricated which comprises a semiconductor substrate 440 having a top surface. A device layer 410 is disposed near the top surface for fabrication of integrated circuits (ICs) therein. An insulating layer 420 underlies beneath the device layer 410 for insulating the device layer with the ICs to be fabricated therein. A highly doped layer 430 is formed beneath the insulating layer 420 in the substrate 440. A substrate contact access means 410-3 for establishing electrical contact with the highly doping layer 430 is provided wherein the access means 410-3 is an opening penetrating from the device layer 410 through the insulating layer 420 to the high doping layer 430. The areas of the device layer 410 exposed to and near the opening 410-3 are insulated with a contact access insulating means. The region of the highly doped layer 430 exposed to and near the opening 410-3 is implanted with a ohmic contact implantation.

Figure 6A:
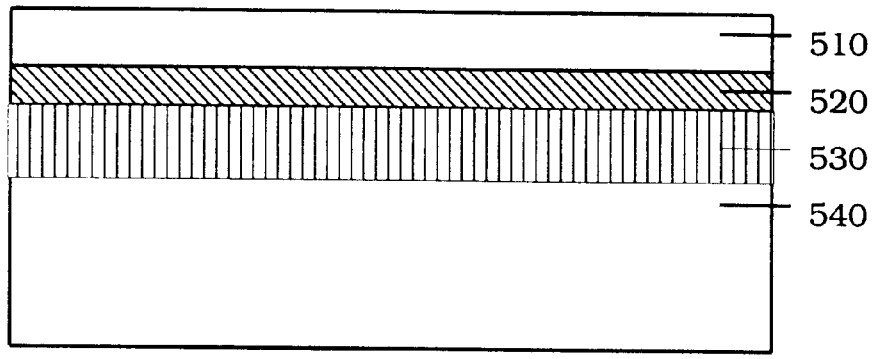
FIGS. 6A–6G are diagrams illustrating by sequential cross-sectional views for representation of the processing steps of the present invention in making a down tap in a SOI wafer.
Figure 6B:
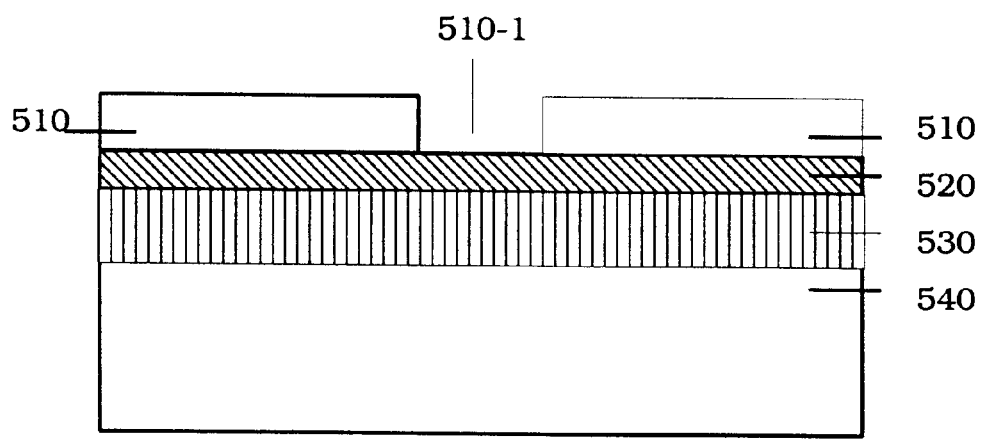
Figure 6C:
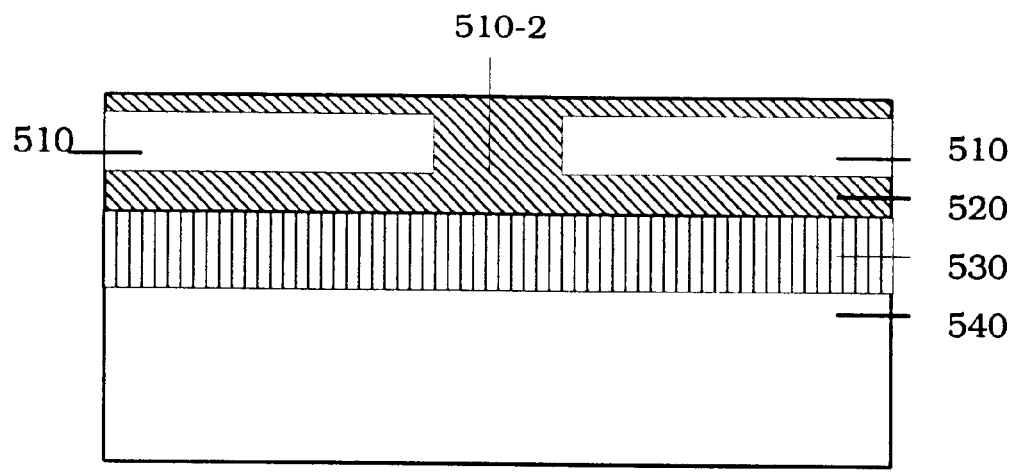
Figure 6D:
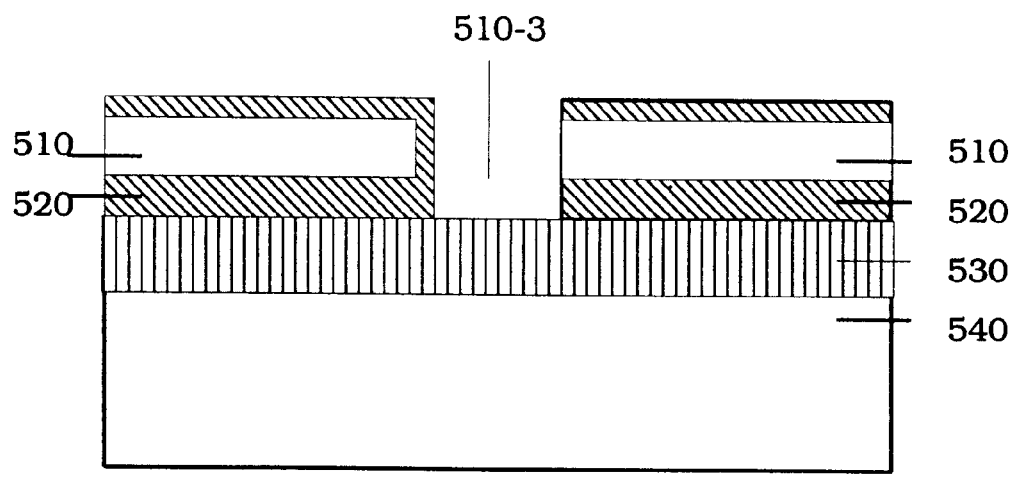
Figure 6E:
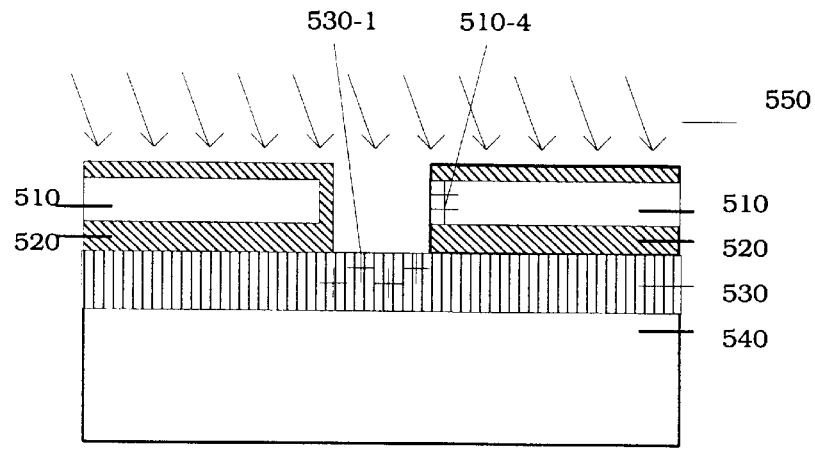
Figure 6F:
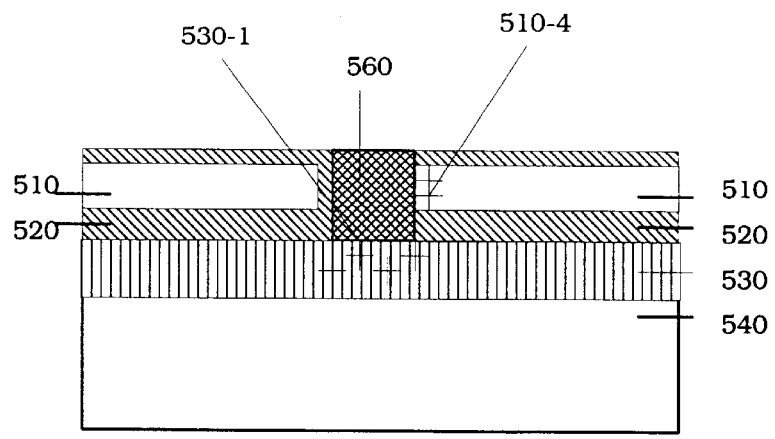
Figure 6G:
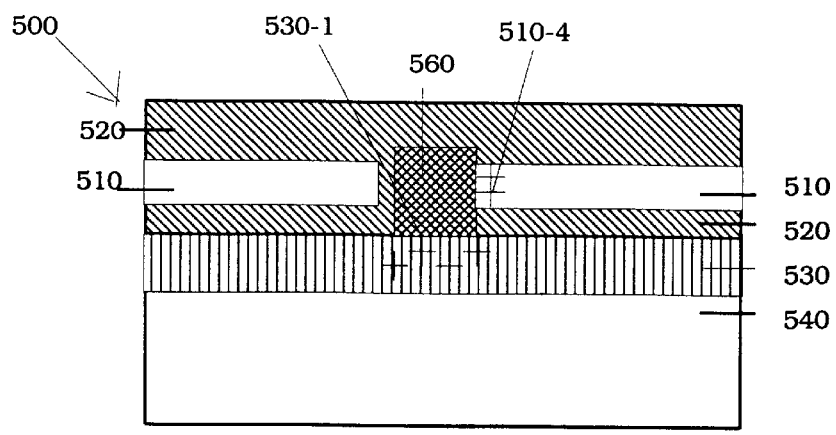

FIGS. 6A to 6G show the processing steps for generating a down tap contact for the SOI wafer 500 according to the present invention. FIG. 6A show that the SOI wafer 500 supported on a substrate bulk region 540 wherein a highly doped layer 530, an insulating layer comprising silicon dioxide 520 and a silicon or epitaxy layer 510 are formed one on top of another in sequence. In FIG. 6B, a portion 510-1 of the top layer, i.e., the silicon or epitaxy layer 510, is patterned and etched away to the top surface of the oxide layer 520. In FIG. 6C, the removed area 510 and the entire top surface area of the wafer is then covered by an oxide layer 510-2. In FIG. 6D, a contact opening 510-3 is produced by patterning and etching away the opening 510-3 down to the top surface of the highly doped layer 530. A portion of the silicon or epitaxy layer 510 is exposed to the contact opening 510-3. In FIG. 6E, an ohmic contact is then formed by implanting metallic ions 550 into the contact opening 510-3. The implantation is performed wherein the implanting metallic ions 550 are being implanted with a tilted angle toward the exposed opening of the silicon or epitaxy layer 510 such that the metallic ions 550 are implanted into the surface areas of the silicon or epitaxy layer 510 and the highly doped layer 530 to form two implant contact zones 510-4 and 530-1. The implant contact zone 510-4 is formed on the surface area at the exposed edge of the silicon or epitaxy layer 510 and the implant contact zone 530-1 is formed on top of the highly doped layer 530 underneath the contact opening 510-3. In FIG. 6F, a metal contact 560 is then formed by depositing metal into the contact opening 510-3 and by etching away the deposited metal with only the contact plug is exposed. A down tap contact is formed through the metal contact 560 which connects the substrate and the silicon or epitaxy layer 510 via the implanting contact zones 530-1 and 510-4 to the external circuits (not shown) when necessary. In FIG. 6G, the top surface of the entire wafer 500 is then covered with an oxide layer 570 before subsequent processing steps on the wafer 500 is carried out.

By the use of the above processes, a SOI wafer 500 provided with an access for down tap contact is fabricated which comprises a semiconductor substrate 540 having a top surface wherein a device layer 510 is disposed near the top surface for fabrication of integrated circuits (ICs) therein. An insulating layer 520 is formed beneath the device layer 510 for insulating the device layer 510 with the ICs to be fabricated therein. A highly doped layer 530 is formed beneath the insulating layer 520 in the substrate 530. A down tap contact access means 510-3 for establishing electrical contact between a down tap contact area 510-4 on the device layer 510 with the highly doped layer 530, the access means 510-3 being an opening penetrating from the device layer 510 through the insulating layer 520 to the highly doped layer 530. The down tap contact area 510-4 is an area on the device layer 510 which is exposed to the opening 510-3 and implanted with ohmic contact implantation. Except the down tap contact areas 510-4, the areas of the device layer 510 exposed to and near the opening 510-3 is insulated with a contact access insulating means. The region 530-1 of the highly doped layer 530 exposed to and near the opening 510-3 is implanted with a ohmic contact implantation.

Figure 7A:
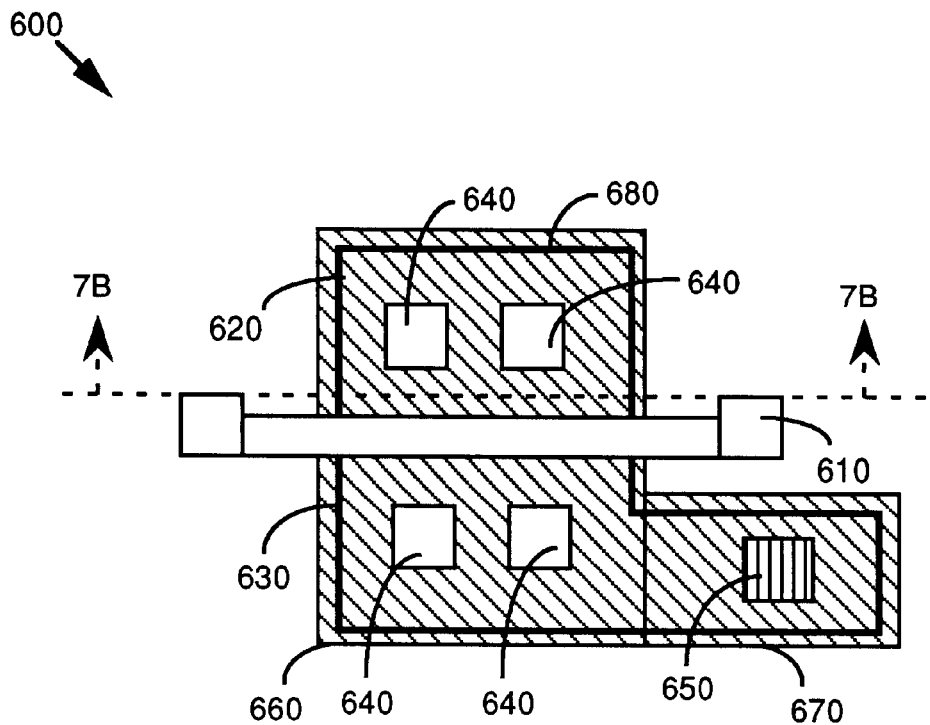
FIG. 7A is a top view of the outline of a transistor with both standard source-drain contact and a down tap contact of the present invention.

FIGS. 7A shows the layout configuration a typical transistor 600 which uses both the standard source/drain contact and the down tap contact utilizing the wafer and the down tap structure disclosed in the present invention. An active transistor area 680 as shown is the enclosed area within the solid line, which includes a channel region covered by a poly gate 610. A drain region 620 and a source region 630 can be disposed on either side of the gate 610. Inside the active area 680 and underneath the gate 610 is the channel region. A source and drain implant region 660 as shown covers the entire areas surrounding the source 630 and the drain 620 except the butting contact implant region 670 which is an outwardly extended area at the lower right corner from the drain 620. The source and drain implant region 660 is implanted with a conductivity type opposite to that of the channel region under the gate 610. A plurality of source and drain contacts 640 are formed in the source and drain implant region 660. At least one butting contact 650 is formed in the butting contact implant region 670 next to the source and drain implant region 660. The butting contact implant region 670 is implanted with a conductivity type same as that for the channel region to form a butting region in connection with the source region 630. The butting contact 670 can be a down tap contact which is fabricated according to the processes as described in FIGS. 6A to 6G.

Figure 7B:
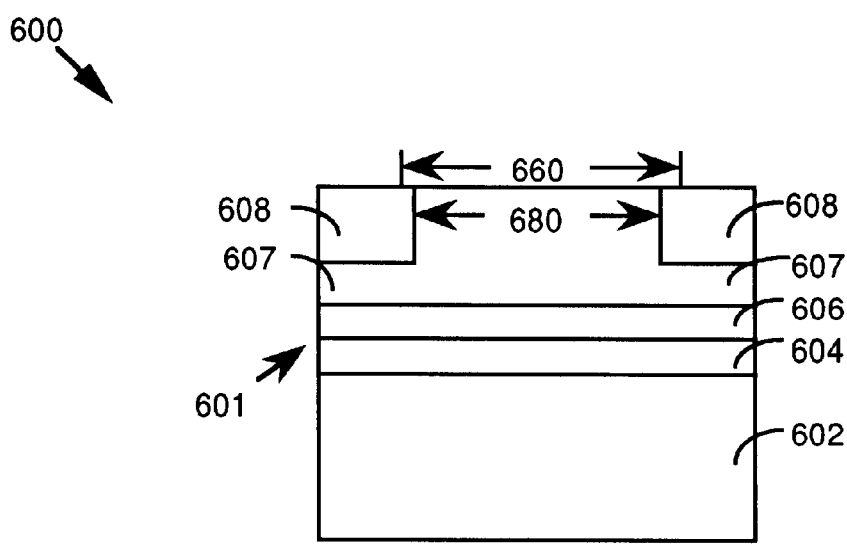
FIG. 7B is a cross-sectional view of the the transistor of FIG. 7A.

FIG. 7B shows a cross-sectional view of the transistor 600 along the line A–A' in FIG. 7A fabricated on an SOI wafer 601. The transistor is supported by a substrate 602 which has a doped layer 604 according to the present invention, and an insulating layer 606 which preferably is an oxide layer to insulate the active transistor 680, i.e., the area enclosed in the solid line in FIG. 7A, near the top surface of the SOI wafer 601. The active transistor area 680 is enclosed in the source and drain implanted area 660 which is also formed near the top surface of the substrate 602 as shown in FIGS. 7A and 7B. The active transistor area 680 is then isolated by the insulating regions 608 from other device areas (not shown). The insulator regions 608 which insulate the active transistor area 680 as shown is formed near the top surface of the SOI wafer 601. The insulating regions 608 is formed to be above the the insulating layer 606 leaving a narrow active layer 607 below the bottom surface of the insulating regions 608 and the top surface of the insulating area 606. This active layer, i.e., a latchup layer 607 allows the butting contact implant region 670 and the butting contact 650 to latchup with the channel region underneath the gate 610. The latchup provides the butting contact 650 which is downtap contact a means to connect and stabilize the channel potential by latching the channel potential with the potential of the doped layer 604.

Figure 8A:
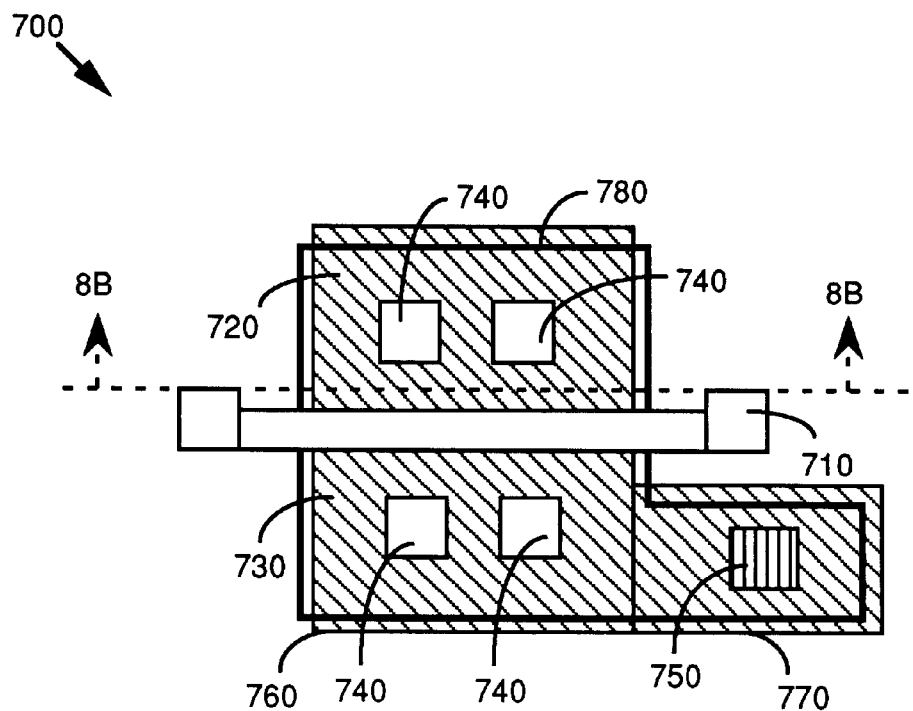
FIG. 8A is a top view of the outline of another transistor with both standard source-drain contact and a down tap contact of the present invention.

FIGS. 8A shows the layout configuration another transistor 700 which uses both the standard source/drain contact and the down tap contact utilizing the wafer and the down tap structure disclosed in the present invention. An active transistor area 780 as shown is the enclosed area within the solid line, which includes a channel region covered by a poly gate 710. A drain region 720 and a source region 730 can be disposed on either side of the gate 710. Inside the active area 780 and underneath the gate 710 is the channel region. A source and drain implant region 760 as shown covers the entire areas surrounding the source region 720 and the drain region 730 except the butting contact implant region 770 which is an outwardly extended area at the lower right corner from the drain 720. The source and drain implant region 760 is implanted with a conductivity type opposite to that of the channel region under the gate 710. A plurality of source and drain contacts 740 are formed in the source and drain implant region 760. At least one butting contact 750 is formed in the butting contact implant region 770 next to the source and drain implant region 760. The butting contact implant region 770 is implanted with a conductivity type same as that for the channel region to form a butting region typically in same side with the source region 730 relative to the gate 710. It should also be noted here that a small active region 765 is allowed between the source and drain implant region 760 near the butting contact region 770. This small active region 765 thus allows the butting contact region 770 to latchup with the channel underneath the gate 710. The butting contact 750 can be a down tap contact which is fabricated according to the processes as described in FIG. 6A to 6G. The latchup between the butting contact region 770 and the channel provided by the small active region 765 allows the butting contact 750 which is downtap contact a means to connect and stabilize the channel potential by latching the channel potential with the potential of the doped layer 704 (shown in FIG. 8B below).

Figure 8B:
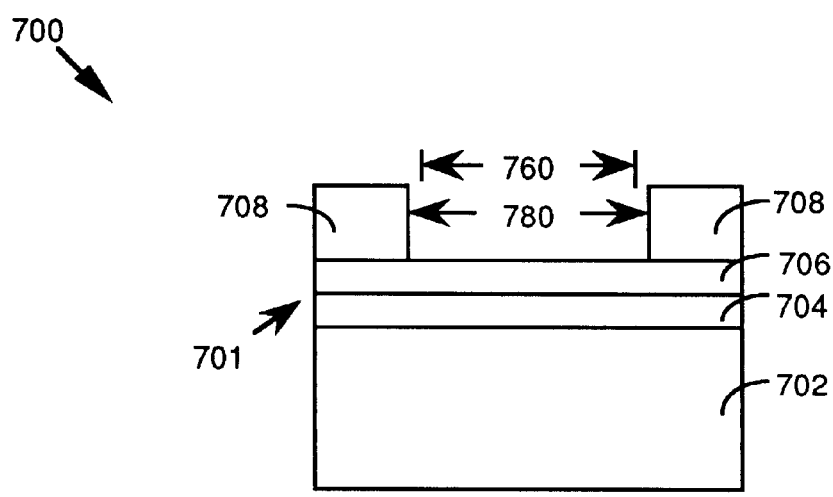
FIG. 8B is a cross-sectional view of the the transistor of FIG. 8A.

FIG. 8B shows a cross-sectional view of the transistor 700 along the line B–B' in FIG. 8A fabricated on an SOI wafer 701. The transistor is supported by a substrate 702 which has a doped layer 704 according to the present invention, and an insulating layer 706 which preferably is an oxide layer to insulate the active transistor 780, i.e., the area enclosed in the solid line in FIG. 8A, near the top surface of the SOI wafer 701. The active transistor area 780 is enclosed in the source and drain implanted area 760 which is also formed near the top surface of the SOI wafer 701 as shown in FIGS. 7A and 7B. The active transistor area 780 is then isolated by the insulating regions 708 from other device areas (not shown). The insulator regions 708 which insulate the active transistor area 780 as shown is formed near the top surface of the SOI wafer 701. The insulating regions 708 is formed to reach the insulating layer 606 thus totally insulate the active transistor area 780. As pointed out above, the latchup between the butting contact region 770 and the channel underneath the gate 710 is now provided by the small active are 765. As the small active area 770 provides the latchup, the cross section as shown in FIG. 7B can also be implemented for this transistor.

This invention thus discloses a configuration for a transistor 600 which is formed on an SOI wafer provided with at least a doped region below an insulating layer in a substrate. The transistor 600 includes an active transistor area 680 which includes a drain region 620, a source region 630, and a butting contact region 670 wherein each of the regions includes a corresponding implant region. The transistor 600 further includes a gate 610 which separates the drain region 620 and the source region 630 wherein the drain region 630 and the source region 620 are doped with a different conductivity type than the gate 610 while the butting contact region 670 is doped with a same conductivity type as the gate and being 610 and is disposed on the same side as the source region 620 relative to the gate 610. A plurality of source and drain contacts 640 are formed in the drain region 620 and the source region 630. At least one butting contact access means is formed (below the butting contact 650) in the butting contact region 670 for establishing electrical contact between the transistor 600 with the doped region below the insulating layer. The access means being an opening penetrating from the butting contact region 670 through the insulating layer to the doped region. The down tap contact access means in the butting contact region 670 further provides a butting contact 650 by including an ohmic contact formed thereon. The active transistor area 680 being insulated by the insulating layer 606 and a surrounding insulating region 608 wherein a latchup layer 607 is allowed between the bottom of the surrounding insulting region 608 and the top surface of the insulating layer 606.

This invention also discloses a configuration for a transistor 700 which is formed on an SOI wafer provided with at least a doped region below an insulating layer in a substrate. The transistor 700 includes an active transistor area 780 which includes a drain region 720, a source region 730, and a butting contact region 770 wherein each of the regions includes a corresponding implant region. The transistor 700 further includes a gate 710 which separates the drain region 720 and the source region 730 wherein the drain region 730 and the source region 720 are doped with a different conductivity type than the gate 710 while the butting contact region 770 is doped with a same conductivity type as the gate and being 710 and is disposed on the same side as the source region 720 relative to the gate 710. A latchup region 775 is formed by restricting the source implant region 720 near the gate 710 and the butting contact area 770 to be smaller thus allowing an open region 775 along the edge of the active transistor area 780. A plurality of source and drain contacts 740 are formed in the drain region 720 and the source region 730. At least one butting contact access means is formed (below the butting contact 750) in the butting contact region 770 for establishing electrical contact between the transistor 700 with the doped region below the insulating layer. The access means being an opening penetrating from the butting contact region 770 through the insulating layer 706 to the doped region 704. The down tap contact access means in the butting contact region 770 further provides a butting contact 750 by including an ohmic contact formed thereon.

By utilizing these configuration, the transistors 600 and 700 formed on an SOI wafer is enabled to establish electrical contact with the doped region below the insulating layer via the butting contact 650 and 750. The advantages of the present invention that the doped region may be used as an electrical charge-sink to provide ESD and EOS protection and that the doped region may be employed as part of the circuit integration to increase circuit design flexibility, to provide more stable channel potential, and to save IC chip area by the use of the down tap contacts can therefore be conveniently realized. Meanwhile, the latchup provided in the above transistors allow the downtap contact to stabilize the channel potential. The problems encountered in the prior art of a total insulated channel region beneath the gate with floating potential is therefore resolved.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A method for fabricating a bond and etch silicon on insulator with well (BESOIW) wafer comprising the steps of:
    (a) forming a first oxide layer on top of a first silicon substrate;
    (b) forming a doped layer on a top surface of a second silicon substrate;
    (c) forming a second oxide layer on top of said doped layer;
    (d) boding said first oxide layer to said second oxide layer to from a bonded insulation layer; and
    (e) grinding off a portion of said first silicon substrate to form a thin silicon layer.

2. The method for fabricating a BESOIW wafer as recited in claim 1 wherein:
    said step (a) further comprises a step of forming an epitaxy layer on a top surface of said first silicon substrate prior to forming said first oxide layer; and
    said step (e) further comprises a step of grinding off said first silicon substrate to expose said epitaxy layer.

3. The method for fabricating a BESOIW wafer as recited in claim 2 wherein:
    said step (e) further comprises a step of grinding off said first silicon substrate and a portion of said epitaxy layer to expose said epitaxy layer with a controlled thickness on top of said bonded insulation layer.

4. The method for fabricating a BESOIW wafer as recited in claim 1 wherein:
    said step (e) further comprises a step of grinding off said first silicon substrate to a controlled thickness on top of said bonded insulation layer to function as a silicon on insulator (SOI) layer.

5. The method for fabricating a BESOIW wafer as recited in claim 1 wherein:
    said step (b) of forming a doped layer on a top surface of a second silicon substrate is a step of forming a P-type doped layer.

6. The method for fabricating a BESOIW wafer as recited in claim 1 wherein:
    said step (b) of forming a doped layer on a top surface of a second silicon substrate is a step of forming a N-type doped layer.

7. The method for fabricating a BESOIW wafer as recited in claim 1 further comprising:
    (f) etching a first opening in said thin silicon layer;
    (g) forming an overlying oxide layer filing said first opening and covering said thin silicon layer;
    (h) etching a second opening through said overlying oxide layer and said bonded insulation layer for exposing said doped layer;
    (i) implanting metallic ions through said second opening to form a contact zone in said doped layer; and
    (j) forming a metal contact by depositing a metal layer in said second opening.

8. The method for fabricating a BESOIW wafer as recited in claim 1 further comprising:
    (f) etching a first opening in said thin silicon layer;
    (g) forming an overlying oxide layer filing said first opening and covering said thin silicon layer;
    (h) etching a second opening through said overlying oxide layer and said bonded insulation layer for exposing said doped layer and a portion of said thin silicon layer;
    (i) implanting metallic ions through said contact opening with a tilted angle to form a contact zone in said doped layer and said thin silicon layer exposed in said step (h); and
    (j) forming a metal contact by depositing a metal layer in said contact opening for contacting said contact zone in said doped layer and said thin silicon layer.

* * * * *